US006198675B1

(12) United States Patent
Hellriegel et al.

(10) Patent No.: US 6,198,675 B1
(45) Date of Patent: Mar. 6, 2001

(54) RAM CONFIGURABLE REDUNDANCY

(75) Inventors: Steven V. R. Hellriegel, Bainbridge Island; Andrew S. Kopser; Robert R. Henry, both of Seattle, all of WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 09/221,190

(22) Filed: Dec. 23, 1998

(51) Int. Cl.$^7$ ............................................. G11C 7/00
(52) U.S. Cl. .................................... 365/200; 365/201
(58) Field of Search ..................................... 365/200, 201

(56) References Cited

U.S. PATENT DOCUMENTS

| | | | |
|---|---|---|---|
| 5,255,227 | * 10/1993 | Haeffele | 365/200 |
| 5,559,743 | 9/1996 | Pascucci et al. | 365/200 |
| 5,566,114 | 10/1996 | Pascucci et al. | 365/200 |
| 5,572,470 | 11/1996 | McClure et al. | 365/200 |
| 5,574,729 | 11/1996 | Kinoshita et al. | 371/10.3 |
| 5,602,786 | 2/1997 | Pascucci et al. | 365/200 |
| 5,659,509 | 8/1997 | Golla et al. | 365/200 |
| 5,742,556 | * 4/1998 | Tavrow et al. | 365/200 |
| 5,764,577 | 6/1998 | Johnston et al. | 365/200 |
| 5,796,653 | * 8/1998 | Gaultier | 365/200 |
| 5,982,678 | 11/1999 | Ferrant | 365/200 |

FOREIGN PATENT DOCUMENTS

| | | |
|---|---|---|
| 0158006A2 | 10/1985 | (EP) . |
| 2764095A1 | 12/1998 | (FR) . |

OTHER PUBLICATIONS

Gail Alverson et al., "Tera Hardware–Software Corporation", in *Proceedings of Supercomputing*, Nov. 1997.
Gail Alverson et al., "Scheduling on the Tera MTA" in *Job Scheduling Strategies for Parallel Processing, 949:of Lecture Notes in Computer Science*, Springer–Verlag, 1995.

Robert Alverson et al., "The Tera Computer System", in *Proceedings of 1990 ACM International Conference on Supercomputing*, pp. 1–6, Jun. 1990.

D.H. Bailey et al., "The NAS Parallel Benchmarks—Summary and Preliminary Results", in *Proceedings of Supercomputing '91*, pp. 158–165, Nov. 1991.

David Callahan, Recognizing and Parallelizing Bounded Recurrences, in *Languages and Compilers for Parallel Computing, 589:of Lecture Notes in Computer Science*, pp. 169–185, Springer–Verlag, 1992.

David Callahan et al., "Improving Register Allocation for Subscripted Variables", in *Proceedings of the ACM SIGPLAN '90 Conference on Programming Language Design and Implementation, SIGPLAN Notices*, 25(6):53–65, Jun. 1990.

(List continued on next page.)

*Primary Examiner*—Richard Elms
*Assistant Examiner*—VanThu Nguyen
(74) *Attorney, Agent, or Firm*—E. Russell Tarleton; Seed IP Law Group PLLC

(57) ABSTRACT

A circuit and method for replacing a defective memory line with a usable memory line. A test is carried out to locate any defective lines, whether a row line or a column line, within a block of memory. If a defective line is found, the identity of the defective line is stored in software code. The software code is stored in a file or table, or other acceptable location, together with the identification of the memory block which is associated with the test data. When the computer is enabled for operation, the test data is loaded from the file into a register associated with the memory. When the memory is addressed, the register prevents addressing to the defective memory line and replaces it instead with an alternative line in the memory which has been tested as usable for storing and retrieving data.

18 Claims, 3 Drawing Sheets

OTHER PUBLICATIONS

David Callahan and Burton Smith, "A Future–based Parallel Language For a General–purpose Highly–parallel Computer", in *Languages and Compliers for Parallel Computing,* pp. 95–113, 1990.

Mark Linton, "The Evolution of Dbx", in *USENIX Summer Conference,* 1990.

Roy F. Touzeau, "A Fortran Compiler for the FPS–164 Scientific Computer", in *Proceedings of the ACM SIGPLAN '84 Symposium on Compiler Construction, SIGPLAN Notices 19*(6):48–57, Jun. 1984.

* cited by examiner

RAM CONFIGURABLE REDUNDANCY

TECHNICAL FIELD

This invention relates to replacing a defective memory line with a usable memory line, and in particular, to the use of an available memory line within the same memory array block as the defective line.

BACKGROUND OF THE INVENTION

It is known that in a large memory array, some memory cells may be defective. It is, of course, possible to discard an entire memory array if one or more cells in the array are defective. On the other hand, it is known in the art that if the number of memory cells which are defective in a given array are few in number, it may be possible to replace these memory cells with usable memory cells on the chip which are not defective.

FIG. 1 shows a memory array having redundant memory cells according to one configuration as used in the prior art. According to this configuration, the array contains main memory blocks, in this instance labeled blocks 1–4. Associated with the main memory block is a row address circuitry and a column address circuitry which can also support defective rows and columns.

One of the blocks may contain a row having two or more defective memory cells, thus causing the entire row to be defective. Further, the memory array may include two or more defective memory cells in a column, causing the entire column to be indicated as defective. According to one prior art technique, the address of the respective defective row or defective column is programmed into the address circuitry of the memory array to prevent access the defective row or column. This programming can take place by blowing fuses in the address circuitry for the defective memory line, thus prohibiting the line being addressed by either the row address circuitry or the column address circuitry.

In one prior art technique, it may be desired to replace the defective memory line with an extra line positioned in a different location on the chip, usually called a redundant line. In such an instance, the address of the redundant line may be stored in the respective row and column address circuitry as a substitute for the defective line. When an attempt is made to address a defective line, the address for a redundant line is substituted by the address circuitry so that data is stored in or retrieved from the redundant line rather than the defective line.

The prior art technique provides the advantage that the entire memory chip does not need to be discarded if there are only a few defective lines in the chip. However, a significant disadvantage is that longer access time is required to access the redundant line than is required for accessing a line in the main memory. This is because of the time required to determine that an attempt has been made to address a defective line and to substitute therefor the address of the redundant line and then to address this redundant line.

There are a number of schemes for providing redundant memory cells to replace defective memory cells in a large array. See, for example, any one of the following U.S. Pat. Nos. 5,574,688; 5,572,470; 5,566,114; 5,659,509; 5,602, 786; and 5,559,743. These above patents describe various schemes for replacing defective memory cells with redundant memory cells and then providing addressing to the redundant memory cells.

SUMMARY OF THE INVENTION

According to principles of the present invention, a memory array is configured to provide fast access to a redundant line in a memory array to replace a defective line. The identification of a defective line is stored in a software program associated with the memory. The term line as used herein refers to either a row line or a column line. When the memory is prepared for use, the program is loaded into an access register. The access register contains identification of a defective line in the memory associated with that particular register. When an attempt is made to address a defective line in the memory, the access register automatically directs the address signal to an alternative line which is not defective. The data can then be stored in or read from the redundant line and use of the defective line is avoided.

According to one embodiment, the alternative redundant line is the next adjacent line in the array block. This has the advantage that extremely fast access time to the redundant line can be provided. Since the address has been completely decoded, all that is necessary is to step the line access signal from the present line to the next adjacent line and then access the memory. Such stepping of the access signal is a very high-speed operation and thus access time to and from the memory is not significantly altered by the presence of a defective line.

According to one embodiment, the register associated with each respective line is a 1-bit register. Each register is associated with a particular block within the memory array. Each of the registers is stored with a selected bit pattern based on the location of the defective line in the array. In particular, the bit pattern begins as a sequence of bits having the same value. At the location of the defective line, the value of the bits transitions to a different binary value, the point of transition marking the location of the defective line within that particular block of the array. Therefore, at the transition point the line associated with the transition point is not addressed and instead the next adjacent row is addressed. As each subsequent adjacent row in the memory is addressed, each of the memory lines being accessed is shifted down 1 from the actual addresses presented.

According to one embodiment, the shifting is provided by having the output of the register control a select line on a multiplexer, the multiplexer having two inputs and one output. In the event the line is prior to a defective line, then a first input of the multiplexer is selected as the output. On the other hand, if the address is at or after a defective line then the register causes the selection of a second input for the output of the particular multiplexer, thus shifting the actual line to be addressed down 1. The present invention thus provides the advantage of extremely fast access time to the memory, even when a redundant line is being accessed.

DETAILED DESCRIPTION OF THE INVENTION

Figure 1:
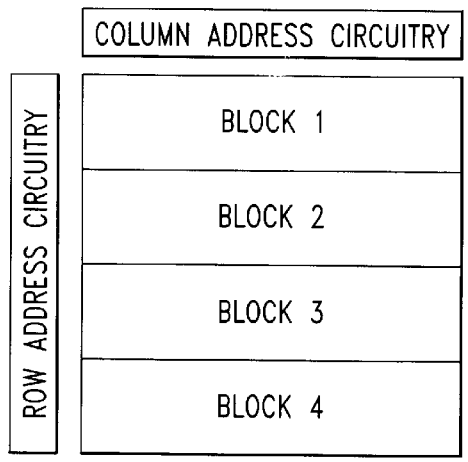
FIG. 1 shows a memory array according to the prior art.
Figure 2:
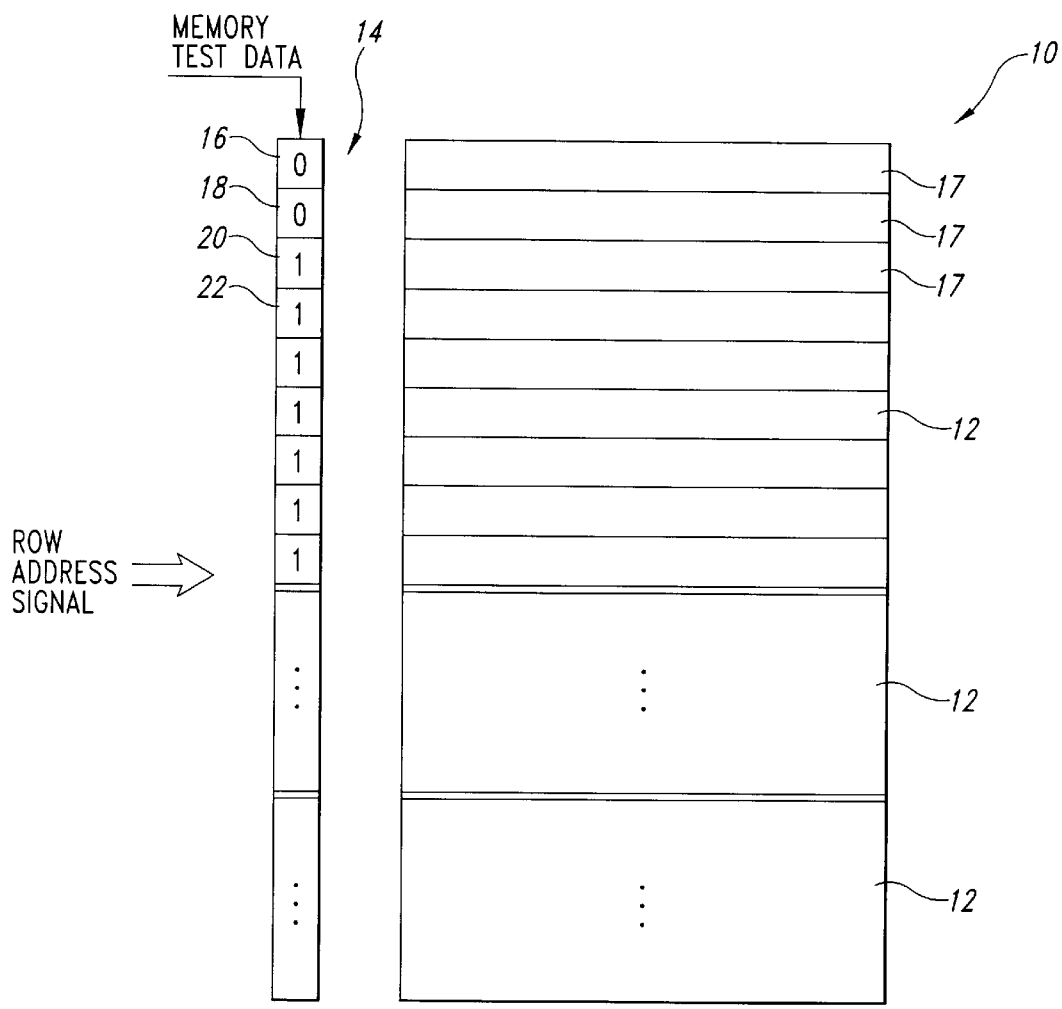
FIG. 2 shows a memory array and a register according to principles of the present invention.

FIG. 2 illustrates a memory array 10 organized according to principles of the present invention. The memory array 10 includes a plurality of blocks 12 with each block having one or more lines. A line can be either a column line of memory cells or a row line of memory cells. In the embodiment shown in FIG. 2, the line is a row of memory cells. In the embodiment shown in FIG. 4, the line is a column of memory cells as will be explained with respect to FIG. 4.

A memory access register 14 is associated with the memory array 10. The memory access register 14 contains a plurality of registers, each register being associated with a particular line in the memory array. Each register is a 1-bit register which can be loaded with a digital code, whether 0 or 1. In the example shown, the first two registers 16 and 18 are loaded with 0 while the subsequent registers 20, 22, and so on are loaded with 1 s. A defective line is identified as that line occurring at the transition from one value to a second value, in this case from a 0 to a 1. Of course, the defective line could just as easily be identified as a transition from 1 to 0. In an alternative embodiment, the defective line is identified by having a first value stored in a memory associated with a usable line, such as a 0, and a second, different value stored in the register associated with the defective line, such as a 1. Any one of these approaches, as well as others, permit quick and easy identification of a defective line within a memory array.

According to principles of the present invention, the array 10 is divided into a plurality of blocks 12, each block having a group of lines 17 therein. In the example shown, each block 12 has nine lines therein, in this case nine row lines. In a preferred embodiment, each block has 17 row lines, though it can have any acceptable number in each block. The block 12 is presented to the user of the memory, in this case a microprocessor, or some other memory access device as having only eight row lines. Accordingly, each block has within it one redundant row line. The redundant row line can replace a defective row line within the same block, as will now be explained in more detail.

As shown in FIG. 2, memory test data is loaded into the register 14 from a separate program. This data is matched to the particular hardware memory to which it is to be associated. This test data is obtained by testing the memory prior to operation. In particular, the memory is tested before installation to locate the presence of any defective row lines. The address of a bad row line is stored. A configuration file is created that contains the address of the defective row line. Every time the computer is started, the stored data from the configuration file is read out and input to the register 14 as shown in FIG. 2. In a preferred embodiment, the registers 16, 18, 20 and the like are simple flip-flops connected as serial shift registers or other easily and quickly accessed memory. The memory test data is shifted into the registers 16, 18, etc. Once the data is loaded into the access register 14, the memory 10 is now ready for use.

The data identifying the defective row can be stored and output by any acceptable technique. For example, an encoded value of the defective row can be stored in memory. This may be more compact than storing a 0 or 1 for each row in memory. When use of the memory is anticipated, the encoded value can be read out and used to point to the defective row. This can be done by causing the proper sequence of 0 and 1, or can be used to just point to the defective row. In one embodiment, the registers 16, 18 and 20 are nonvolatile memory cells, such as a floating gate EEPROM. The state is programmed as a 1 or 0 upon testing the memory. Thereafter it is not necessary to store or load the test data again. It is stored as firmware or as programmed memory cells on the chip itself and the value of the bit will always be the same. A startup and load of test data each time is thereafter not required in this embodiment.

A row address signal is then provided as desired to store or obtain data. When the row address signal is presented to the memory array, the address passes through circuits associated with the particular register associated with that particular line of memory. For example, for register 18, which is the second register, the row address signal to the second row line in the memory array 10 would pass through the register 18 or circuits driven by register 18. If the bit, or the transition of bits from one value to another as stored in the memory access register 14 indicates that a defective row is present then access to the address row is denied and access is provided to an alternative row so that data can be stored in, or read from, memory 10.

There are a number of techniques by which the data stored in the memory access register 14 can be identified and associated with usable rows in the memory block 12 while blocking access to defective row lines in the memory block 12.

Figure 3:
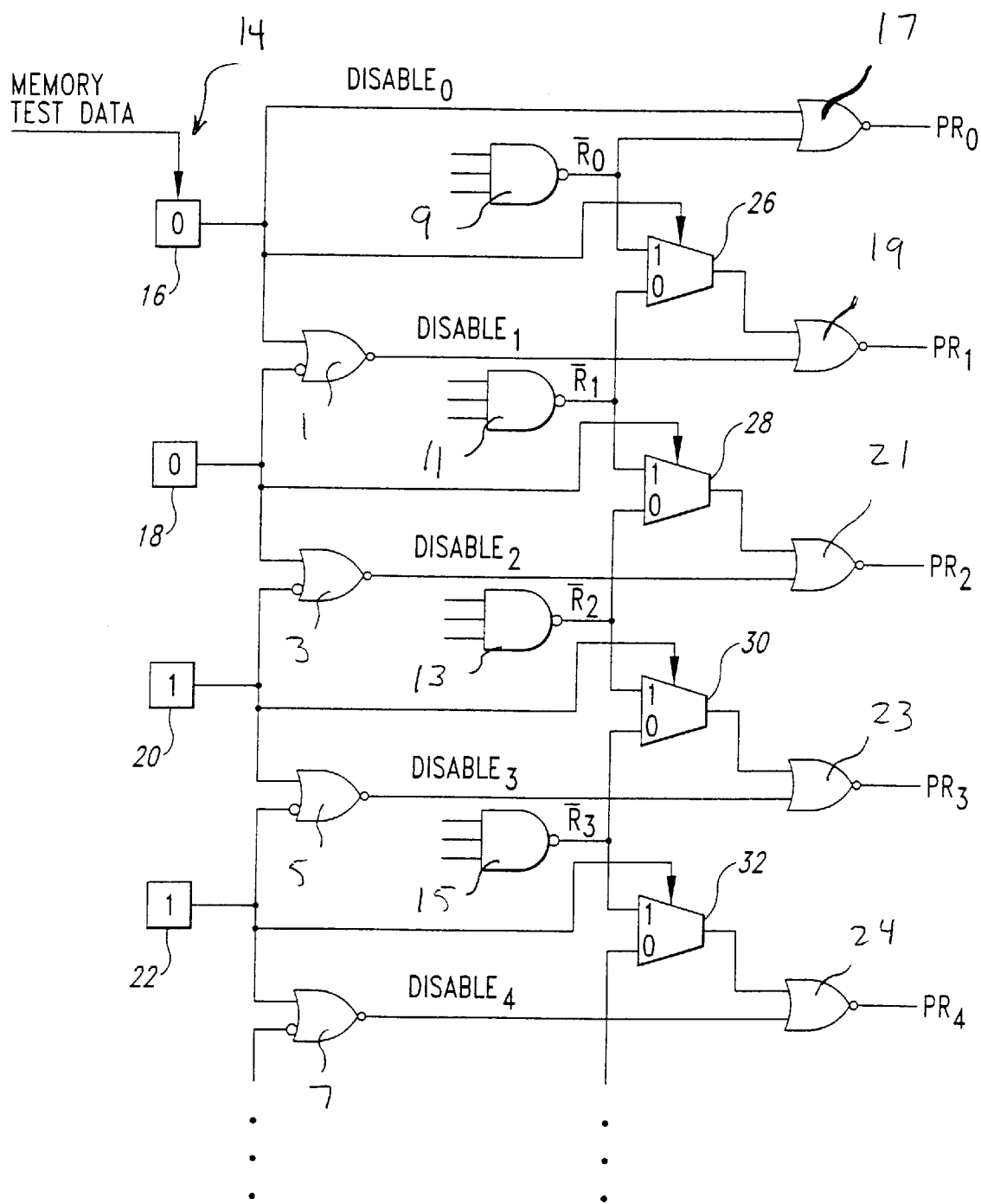
FIG. 3 illustrates a circuit schematic for one possible circuit for shifting the address of a defective memory line to a usable memory line.

FIG. 3 illustrates one acceptable circuit for providing the row address signal to the usable row lines and not providing the row address signal to the defective row line. According to this embodiment, the row address signal is provided to final decode circuitry logic gates whose inputs include the final decode for address signal for $R_0$, $R_1$, $R_2$, $R_3$, and the like. In the embodiment shown, the logic circuits are NAND gates, but any acceptable logic such as AND, NOR, or other type gates may be used as the final decode logic for the address signal. When the row address signal is provided to the final decode logic, the output of the register 14 is provided to a respective multiplexer associated with each physical row in memory. The output of the multiplexer drives the physical row access line PR which is usually the word line for that row in the physical memory.

A group of NOR gates 1, 3, 5, 7, etc. provides the signal from the register 14 to disable the appropriate row in the physical memory. NAND gates 9, 11, 13, 15, etc. provide the final decode step of the address and input to the respective multiplexers. Only the first four registers and associated selection circuits to drive the memory 10 are shown, but 9 are provided as shown in FIG. 2. Of course, this pattern is repeated to provide selection of 16 rows (17 physical rows), 32 rows (33 physical rows), or more as needed.

The select line for the multiplexer, whether to select input 0 or input 1 as the output is provided from the access register 14, in particular, from the single bit register associated with that particular row line. If the row associated with the register is a usable row, then a first value, such as a 0, will be stored in the respective access register 16, 18, and the like. This will cause the respective NOR gate to be enabled and the input 0 to be provided as the output of multiplexer 26, as shown. If row 0 is a usable row, then NOR gate 17 will be enabled and the decode of $R_0$ address will cause physical row 0 to be selected for access and an address of $R_1$, will cause the decoded $R_1$ to drive the physical row line $PR_1$ in the memory. Assume, in the example shown, that the third physical row line, $PR_2$, is the defective line. Accordingly, in the first two registers 16 and 18 are stored the same bit, in this instance a 0. At the third register 20, the bit transitions to a different value, a 1. The transition from a 0 to a 1 is a marker for the deflective row line. This causes the physical row $PR_2$ to be disabled for either input or output. In addition, $PR_3$ is selected as the row line to be accessed when the row address is for $R_2$. This provides a selection of a usable row and passes completely over the defective row, in this event $R_2$. Access to row $R_2$ is blocked because the output of multiplexer 28 is disabled by NOR gate 21 from register 20.

The address signal to NAND gate 13 when it is decoded as an $R_2$ is provided to the input of multiplexer 30. The register 20 causes selection of the R$_2$ input as the output to drive PR$_3$. All subsequent counters in the same register block 14 are loaded with a 1, as shown in FIG. 2. All subsequent access to the physical memory array has the row line shifted by 1 for the row address.

Thus, in a manner totally transparent to the microprocessor, and in fact completely transparent to the row address decoder, the defective row is replaced instead with a usable row. Access to the defective row is denied. This occurs at the final row line access stage, as the address is completely decoded. This has the distinct advantage of being extremely fast, and avoids cumbersome prior art techniques for identifying, locating, and replacing a defective row with a usable row.

Of course, the circuit of FIG. 3 is only one example for implementing the connection between the access register 14 and with the physical row within the memory array 12. Other acceptable techniques, using other logic may be used. The present invention provides the advantage of extremely fast access to every line in the memory, including replacement lines for defective lines. The only circuit added into the line is a simple multiplexer or similar type logic, therefore access speed to any line in the memory is substantially the same. In addition, because the replacement row is immediately adjacent to the defective row, fast access is provided. According to a further alternative embodiment of the invention, the alternative row may be at a different position than immediately adjacent the defective row in order to avoid the possibility of a defect caused by two adjacent rows having defective memory cells therein. For example, the alternative row can be placed at the bottom row within each memory block.

The present invention contemplates at least one additional line will be provided for each block of memory. Accordingly, so long as there is only one defective line within each block of memory, then such defective line can easily be replaced by an alternative line. In a preferred embodiment, each block of memory contains 16 addressable rows which are usable by the microprocessor. However, the physical array of each memory block includes 17 rows so that each block contains one redundant row. In an alternative embodiment, two extra rows are provided per block so that up to two defective rows can be replaced per block. This is especially useful to replace adjacent defective rows as sometimes happens in memory arrays. The access register 14 contains one register associated with each physical line in memory and the data for the register 14 is created when testing each individual block and stored in the configuration file as associated with that particular block of memory.

Figure 4:
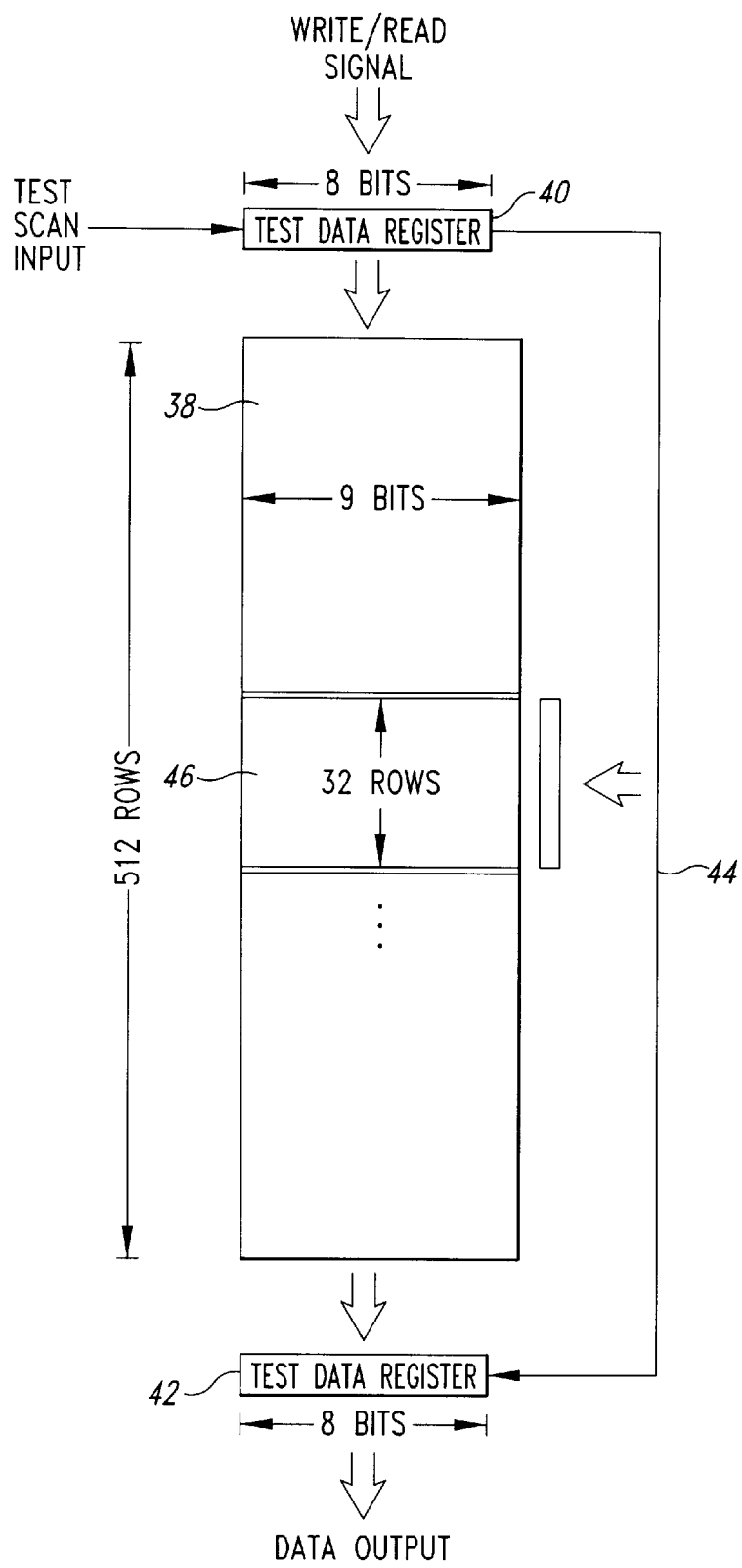
FIG. 4 is a block diagram of shifting the access of data to or from a memory array to prevent access to defective lines and substituted therefor access to usable lines in the memory array.

FIG. 4 illustrates an alternative embodiment for providing access to and from a line of memory cells. In the embodiment of FIG. 4, the line to be replaced if defective is a column line. According to the embodiment of FIG. 4, the column of memory cells 38 includes a test data register 40 at the input and a test data register 42 at the output. The registers 40 and 42 are each respectively 8 bits and the system operates with an 8-bit word for this particular memory. Accordingly, the microprocessor looks for and expects to receive a signal which is 8 bits wide. According to principles of the present invention, the physical register file 38 is 9 bits wide. Therefore, there is one redundant column within each register 38. The data which is being provided for access to a particular column in the register 38 is organized along the same lines as that provided for the row address signal and therefore is treated in a similar manner by the registers 40 and 42. In particular, in the embodiment of FIG. 4 the address signal has been completely decoded and the write or read data is being provided directly to the register 40. The register 40 itself therefore does not provide any additional decoding or column identification of the register 38. Instead, the register 40 provides a simple shift from one column to a next adjacent column depending on the location of the defective memory cell. This is accomplished as follows.

The register 38 is tested prior to the operation of the memory to locate any defective column line in the memory. In the event a defective column is found, the identity of the location of that memory column is stored in a program. When the memory is enabled for use, the identity of the defective column is scanned into the register 40 from a test scan input. The test scan input provides a simple shifting of the column to be accessed to the next adjacent column if there is a defective column. This can be accomplished by simply shifting the data stream over to one adjacent column at the location of the defective column using the appropriate logic gates. Appropriate logic gates to do this include such gates as an AND, NAND, exclusive-OR or other logic device as will be easily usable by those of skill in the art. Further, the output register 42 is shifted in an identical fashion, since it received the same test scan input via line 44 as shown in FIG. 4. Accordingly, when the data is output from the output register 42, the microprocessor sees all 8 bits properly organized as if there were no defective column within the register 38.

According to one embodiment, the register 38 contains 512 rows organized in 16 blocks of 32 rows each. Each block may also include an extra row so that defective rows may be replaced as previously described with respect to FIG. 2. However, in a preferred embodiment, no additional rows is provided inside the register 38. Instead, within each block 46 a row is identified which stores no data, namely, all data stored in the particular row is known to be a 0. In this instance, when such a row is addressed the output is automatically required to be a 0 for the entire row by logic circuitry within the address decoder. The memory itself is not addressed, instead once the row being addressed is recognized as a row storing all zeroes, an output signal is provided indicating that the value of all memory cells in that row is 0. Thereafter, if a defective row is identified within a particular block 46, then the unused row becomes an alternative row which can be used to replace the defective row using the same technique as described with respect to FIGS. 2 and 3.

In one particular embodiment, a system protocol requires as one of its rules that the first row of each block 46 contain all zeroes. This is a particular protocol of some systems to provide initialization of other circuits and programs within the computer, as well as identification of certain locations in the register 38. Accordingly, it is known during system design that the first row in each of the blocks 46 will be programmed to store a 0 in each memory cell in the first row. This first row thus becomes available for use as the alternative row using the memory address technique previously described. In the event a defective row is located within this block 46, each of the other rows can be shifted up 1 and the address to the defective row can be disabled as described. In another embodiment, the address of the defective row is stored in a test data register or X-or (exclusive-or) with all incoming addresses. This has the advantage of using less hardware while accomplishing the same task.

A number of embodiments have been described for quickly and easily replacing defective lines in a memory with alternative lines. According to a preferred embodiment, the defective line is provided within the same memory block so that fast access, as well as ease of identification of the defective row and transition to the usable row is possible. So long as there is only one defective row per memory block, such a scheme is extremely workable and has been found acceptable in practicing the present invention. According to an alternative embodiment, it is possible to provide two or more replacement lines within each block of memory, thus effectively doubling the ability to replace possible defective lines within a memory array with usable lines. A significant advantage is also provided by having the identity of the location of the defective row quickly and easily loadable by software code into a particular register located at the last stage of the address signal.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method of replacing a defective memory line with a usable memory line, comprising:

loading the identification of a defective line in the usable memory into a register associated with the usable memory;

decoding an address signal and sending the decoded address signal to a plurality of multiplexers coupled to the usable memory; and disabling the defective line and selecting the decoded address signal for an alternative line when an address of the defective line is presented for writing or reading including using the identification of the defective line loaded in the register as control signals for the plurality of multiplexers.

2. The method according to claim 1 wherein the defective line is a defective row in a block of memory.

3. The method according to claim 1 wherein the defective line is a defective column in a block of memory.

4. The method according to claim 1 wherein the alternative line is the next adjacent line.

5. The method according to claim 1 wherein the step of loading the identification of a defective line in the memory into a register includes the step of:

loading a sequence of "0" and "1" into a register, the register having one bit associated with each line in the memory;

storing bits having the same value adjacent to each other when the associated line is usable;

storing bits having opposite values adjacent to each other when the associated line is defective.

6. The method according to claim 1 wherein the step of loading the identification of a defective line in the memory into a register includes the step of:

associating a bit in each register with a line in memory;

loading a shift bit into the register at the line location that contains the defective line to cause the next adjacent line to be accessed each time access is attempted to a defective line.

7. The method according to claim 1 wherein the step of loading the identification of a defective line includes storing an encoded value represents the identity of the defective row.

8. A configurable memory redundancy circuit, comprising:

a memory array composed of one or more blocks;

a plurality of lines of memory within each block;

a register associated with each line of memory within each block; and an enable circuit comprising a multiplexer connected between each line of the block and each register associated with the respective line, each register providing a control signal to a respective multiplexer and to a disable circuit for blocking access to a defective line in the block and selecting one of a plurality of decoded address signals for each line plurality of lines of memory within each the block.

9. The circuit according to claim 8, further comprising an address decode circuit associated with a single line and having an output coupled to two adjacent multiplexers.

10. The circuit according to claim 9 wherein the defective line is a row of memory cells.

11. The circuit according to claim 10 wherein the register includes a single bit register storing either a "1" or a "1" associated with each row in the block.

12. The circuit according to claim 10 wherein each multiplexer provides access to the addressed row when the addressed row is not defective and provides access to the row adjacent the addressed row when it is defective.

13. The circuit according to claim 10 wherein the address decode circuit comprises a NAND gate; and further comprising:

a multiplexer associated with each row;

a first NOR gate associated with each row and having a first input coupled to the multiplexer associated with the row and an output coupled to the row; and a selection line from the register to a control input of the multiplexer to select the addressed row if the row is usable and to select an alternative row if the row is defective, the selection line further coupled to a second input of the first NOR gate.

14. The circuit according to claim 13 wherein the alternative row is the next adjacent row.

15. The circuit according to claim 9 wherein each block of memory includes a single redundant line and the enable circuit is configured for:

shifting the address from a defective row to the next adjacent row to replace the defective row; and shifting each subsequent row to the adjacent row for access by the address signal.

16. The circuitry according to claim 15 wherein said line is a column line within a memory register.

17. The circuit of claim 13, further comprising a second NOR gate coupled between the first NOR gate and the register.

18. The circuit of claim 17, wherein the second NOR gate has first and second inputs coupled to respective adjacent bit registers and configured to disable a defective row.

* * * * *

UNITED STATES PATENT AND TRADEMARK OFFICE
CERTIFICATE OF CORRECTION

PATENT NO.    : 6,198,675 B1                                    Page 1 of 1
DATED         : March 6, 2001
INVENTOR(S)   : Steven V.R. Hellriegel et al.

It is certified that error appears in the above-identified patent and that said Letters Patent is hereby corrected as shown below:

Section (56), References Cited, Title page, reference "5,982,678" should read -- 5,982,679 --.

Column 8,
Lines 23 and 24, "either a "1" or a "1" associated" should read -- either a "1" or a "0" associated --.

Signed and Sealed this

Fourteenth Day of August, 2001

*Attest:*

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO. : 6,198,675 B1　　　　　　　　　　　　　　　　　　　　　　Page 1 of 1
DATED : March 6, 2001
INVENTOR(S) : Steven V. R. Hellriegel, et al.

It is certified that error appears in the above-identified patent and that said Letters Patent is hereby corrected as shown below:

<u>Column 8, claim 8,</u>
Line 15, "each line plurality" should read -- each line of the plurality --.
Line 16, "within each the block." should read -- within each block. --.

Signed and Sealed this

Thirteenth Day of November, 2001

Attest:

*Nicholas P. Godici*

NICHOLAS P. GODICI
*Attesting Officer*　　*Acting Director of the United States Patent and Trademark Office*